US006511282B2

(12) United States Patent
Notohardjono et al.

(10) Patent No.: US 6,511,282 B2
(45) Date of Patent: Jan. 28, 2003

(54) MODULAR AND FLEXIBLE SERVICE FRAME ENCLOSURE

(75) Inventors: Budy D. Notohardjono, Poughkeepsie, NY (US); John S. Corbin, Jr., Austin, TX (US); Steven C. McIntosh, Kingston, NY (US); Howard P. Welz, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/892,822

(22) Filed: Jun. 27, 2001

(65) Prior Publication Data

US 2001/0036399 A1 Nov. 1, 2001

Related U.S. Application Data

(62) Division of application No. 09/547,775, filed on Apr. 12, 2000.

(51) Int. Cl.[7] .............................................. B65G 1/02
(52) U.S. Cl. ............... 414/800; 248/188.4; 248/346.05; 248/500; 248/678
(58) Field of Search .................... 414/800; 248/500, 248/600, 188.2, 188.4, 650, 678, 346.05

(56) References Cited

U.S. PATENT DOCUMENTS

| | | | |
|---|---|---|---|
| 3,973,078 A | 8/1976 | Wolf et al. ............... 174/42 |
| 4,040,590 A | 8/1977 | Baratoff ................. 248/358 |
| 4,783,986 A | 11/1988 | Koshelev ................. 72/455 |
| 5,236,165 A * | 8/1993 | Conway .................. 248/503.1 |
| 5,303,524 A | 4/1994 | Caspe .................... 52/167 |
| 5,310,156 A | 5/1994 | Matsumura et al. ........ 248/615 |
| 5,357,723 A | 10/1994 | Sasaki et al. ............ 52/167 |
| 5,383,723 A | 1/1995 | Meyer .................. 312/265.4 |
| 5,396,782 A | 3/1995 | Ley et al. ................ 62/295 |
| 5,431,365 A | 7/1995 | Hopkins ................. 248/683 |
| 5,644,991 A * | 7/1997 | Prevot et al. ............ 108/54.1 |
| 5,664,688 A | 9/1997 | Kitanaka et al. ............ 211/26 |
| 5,813,650 A | 9/1998 | Tsukamoto et al. ......... 248/638 |
| 5,833,206 A * | 11/1998 | Peacock ................. 248/677 |
| 5,842,312 A | 12/1998 | Krumme et al. ........... 52/167.1 |
| 5,875,601 A * | 3/1999 | Gutelius, Jr. et al. ....... 52/698 |
| 5,913,503 A | 6/1999 | Satoh et al. ............. 248/636 |
| 5,946,867 A | 9/1999 | Snider, Jr. et al. ......... 52/167.1 |
| 6,024,330 A * | 2/2000 | Mroz et al. .............. 248/188.4 |

FOREIGN PATENT DOCUMENTS

JP          05305666          6/1995

* cited by examiner

Primary Examiner—Steven A. Bratlie
(74) Attorney, Agent, or Firm—Floyd A. Gonzalez; Cantor Colburn LLP

(57) ABSTRACT

An earthquake resistant frame structure which is shippable in a fully populated condition has a base member, a plurality of support members extending from the base member, a top portion disposed over the ends of the support members, a extension member disposed over the top portion, side stiffeners positioned perpendicularly between the support members, and a tie down assembly system positioned between the base member and a flooring surface. The extension member has a platform section and at least two legs depending substantially perpendicularly therefrom that slidingly engage the support members. The two legs have slots therethrough configured to receive fasteners that, when secured to support members, secure and maintain the extension member in position. First and second panels protrude laterally from the frame structure to form an extension area, from which a bracket hingedly depends. A variety of pin arrangements are used to prevent the removal of the bracket from the hinge. The tie down system includes a floor plate positionable between the frame structure and the flooring surface, a fastener extending through the frame structure, through the floor plate, and into the flooring surface, a leveling element positioned between the floor plate and the flooring surface to level the frame structure, and insulators positioned between the fastener and the leveling element to attenuate vibration.

8 Claims, 8 Drawing Sheets

MODULAR AND FLEXIBLE SERVICE FRAME ENCLOSURE

CROSS-REFERENCE TO RELATED APPLICATION

This application is divisional application of U.S. Ser. No. 09/547,775 filed Apr. 12, 2000, the disclosures of which are incorporated by reference herein in their entirety.

BACKGROUND OF THE INVENTION

This invention relates to a frame structure for housing electronic equipment, and, more particularly, to an earthquake resistant support frame for electronic equipment.

Electronic equipment, which may be mainframe computers, information technology equipment, telecommunications circuitry, air traffic control systems, or similar equipment, generally comprises sophisticated and delicate components assembled in a manner such that the electrical and mechanical connections therebetween are delicate and subject to interruption of the continuous flow of electronic data as a result of the loss of the connection. Continuous flow of electronic data through the electronic equipment is often of critical importance to a system and can lead to detrimental results in the event of an interruption of that flow. Frame retention systems that form an integral part of electronic equipment systems are designed to ensure the continuous flow of data and are utilized to curtail the likelihood of damage to electronic equipment that may result from either man-made or natural vibratory motion.

The vibratory forces generated by an earthquake or other seismic shock activity can often be of a sufficient magnitude to break the physical connections between the electrical and mechanical components. Various degrees of protection can be afforded to electronic equipment in order to prevent or limit the amount of damage that can potentially result from seismic activity. Frame retention systems in the form of aseismic support structures and methods of securement have been developed and are used within the electronics industry to compensate for the vibrations resulting from this seismic activity.

In order to prevent the interruption of the flow of data, the electronic equipment should be installed and secured in such a manner so as to withstand or resist the vibratory forces that may detrimentally affect the connections. It is a normal practice within the electronic industry, as known from the prior art, to contain the electronic equipment within a frame-like structure and secure the structure to a base, which is usually fixedly secured to the floor. The frame-like structure, as well as the base, is usually modular; however, the sections involved are typically of massive size and weight to accommodate the large vibratory forces generated by earthquakes.

While this method is straightforward and effective, the structures involved, viz., the frame itself as well as the base, are often costly to manufacture and do not lend themselves to being conveniently moved to the site of installation. Moreover, this method fails to address the problem of relocation of the equipment.

Another method of preventing interruption of data flow is through the use of less rigid structures that allow the frame to flexibly shift under the vibratory forces generated by earthquakes. In particular, one approach is to mount casters on an underside of the frame to allow the frame free access to movement over a surface. Normally, the casters can be braked such that the frame is prevented from movement during normal use. If vibratory forces of a sufficient and predetermined magnitude are sensed and experienced by the frame, the caster braking system can be released so that the movement of the frame absorbs the energy of the earthquake. The use of casters as support members, however, contributes to the instability of the frame as vibratory forces are experienced. In the event of a significant earthquake, the vibrations generated may be sufficient to cause the frame to tip over.

SUMMARY OF THE INVENTION

An electronic equipment frame having an integrated earthquake restraint system is needed that is of a manageable size and weight. The inventive frame is a flexible structure being adjustable vertically with respect to a level plane of a flooring surface to accommodate electronic equipment of heights variable between 36 units EIA and 42 units EIA loaded at up to 35 pounds per unit EIA. The structure may be modified to accommodate electronic equipment of heights that are greater than 42 units EIA. An optional brace, when properly secured, renders the frame capable of withstanding a higher NEBS rating and, in one embodiment of the invention, an NEBS GRE-63 Zone 4 earthquake rating. Without the brace, the frame is capable of withstanding NEBS GRE Zone 1 and Zone 2 earthquake ratings. Furthermore, the inventive frame is mountable to either a raised or a non-raised flooring surface using a leveler and tie down system that ensures a uniform height over a level area of the frame, induces a pre-stress load over the flooring surface, and provides adequate insulation and vibrational attenuation to the electronic components. The floor mounting plate is easily accessible to allow the frame to be easily moved.

An earthquake resistant frame structure has a base member, a plurality of support members extending normally from the base member, a top portion disposed over the end portions of the support members, a extension member disposed over the top portion, side stiffeners positioned perpendicularly between the support members, and a tie down assembly system positioned between the base member and a flooring surface. The extension member has a platform section and at least two legs depending substantially perpendicularly therefrom that slidingly engage the support members. The two legs have slots or holes therethrough configured to receive fasteners that, when secured to the support members, secure and maintain the extension member in position.

First and second panels protrude laterally from the frame structure to form an extension area, from which a bracket hingedly depends. The bracket, which is generally triangular in shape, is removably attached to the first panel. Removal of the bracket can be prevented by the installation of a locking hinge assembly. The locking hinge assembly is an L-shaped hinge having a first end pivotally received on the first panel and secured thereto. A second end of the L-shaped hinge is fixedly attached to the bracket. A variety of pin arrangements are used to prevent the removal of the bracket from the L-shaped hinge. The edge of the bracket that is distal from the hinged edge is securable to the second panel using a plate and bolt assembly.

The extension member includes a platform section and a plurality of legs depending from the platform section. Each leg includes openings therein that are engageble with corresponding openings in the frame structure. The extension member is securable to the frame structure by the insertion of fasteners extending through the openings in the legs and into the corresponding openings in the frame structure. Typically, the fasteners are bolts that are received through the openings in the legs and are threaded into the corresponding openings in the frame structure.

The tie down system includes at least one floor plate positionable between the frame structure and the flooring surface. A fastener extends through the frame structure, through the floor plate, and into the flooring surface. A leveling element is positioned between the floor plate and the flooring surface to level the frame structure, and insulators are positioned between the fastener and the leveling element to damp vibration.

The above-described inventive frame also enables an electronic system to be shipped fully populated. Casters are rollably fixed to the bottom of the frame, thereby allowing the frame to be easily rolled during shipment onto and off of a transport device and rolled to its final delivery location. Installation of the frame using the leveling elements, which are threaded such that the frame can be raised and lowered by articulating the leveling elements, allows the casters to remain secured to the bottom of the frame after the frame is mounted to the floor plates.

DETAILED DESCRIPTION OF THE INVENTION

Figure 1:
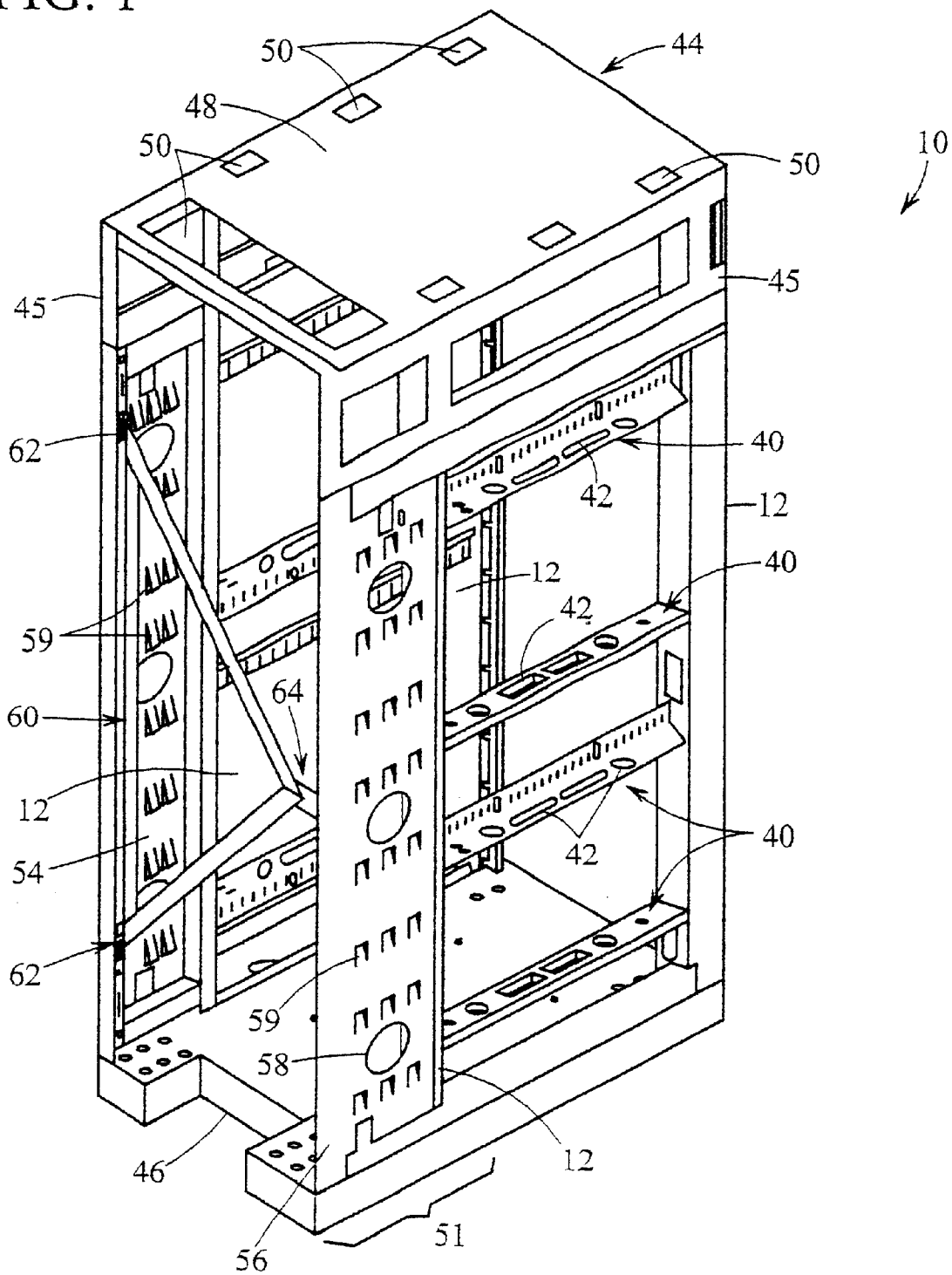
FIG. 1 is perspective view of the flexible frame tie down retention system, or frame, of the present invention.
Figure 2:
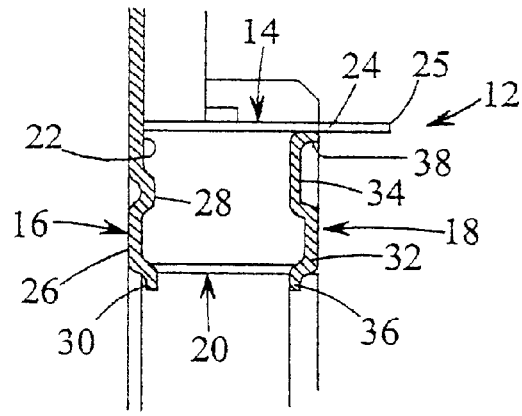
FIG. 2 is a cross sectional view of a support member of the frame, of the present invention.

Referring to FIG. 1, the inventive integrated flexible frame tie down retention system for raised and non-raised floor applications is shown generally at 10 and is hereinafter referred to as "frame 10". Frame 10 is an open box-like structure and comprises a plurality of support members 12 arranged in a parallel configuration to form the edges of frame 10. The length of one side of the box-like structure is typically less than adjacent sides of the box-like structure, thus giving the box-like structure a substantially rectangular cross sectional shape. In a preferred embodiment, frame 10 is oriented such that support members 12 are positioned vertically with respect to a level plane of a flooring surface (not shown). In FIG. 2, a cross sectional view of support member 12 illustrates the configuration of each individual wall element of support member 12. While only one support member is referenced below, additional support members are similarly configured. Support member 12 comprises four walls 14, 16, 18, 20, each being individually shaped and assembled to impart optimum strength to frame 10. In a preferred embodiment, walls 14, 16, 18, 20 are fastened together preferably by welding or riveting.

First wall, shown generally at 14, comprises an L-shaped member having a shorter leg 22 and a longer leg 24. The side of longer leg 24 that is opposite the direction of projection of shorter leg 22 forms an exterior surface of support member 12 that faces away from frame 10. A portion of longer leg 24 extends beyond the point at which second wall 16 engages first wall 14 to form a flange 25.

Second wall, shown generally at 16, comprises a flat member 26 having a ridge 28 disposed therein and an edge that is bent to form a lip 30. Ridge 28 is of a semi-circular cross section and extends along a lengthwise plane of flat member 26. Lip 30 likewise extends along the same lengthwise plane of flat member 26 parallel to ridge 28 and is bent in the same direction that ridge 28 projects out of the plane of flat member 26. Second wall 16 is fixedly connected to shorter leg 22 of first wall 14 such that second wall 16 intimately engages the surface of shorter leg 22 of first wall 14 that faces away from longer leg 24 of first wall 14. The side of flat member 26 that is opposite of the direction in which ridge 28 projects forms another exterior surface of support member 12 that faces away from frame 10.

Third wall, shown generally at 18, comprises two flat planar members 32, 34 connected such that the plane of first flat planar member 32 is offset from the plane of second flat planar member 34. A lip 36 is formed along the outer edge of first flat planar member 32. The opposing edge of third wall 18, which is the outer edge of second flat planar member 34, is also bent to form a lip 38 positioned to be ninety degrees relative to the plane of second flat planar member 34. Third wall 18 is fixedly connected to first wall 14 such that third wall 18 is parallel to second wall 16 and such that a surface of lip 38 intimately engages the surface of longer leg 24 of first wall 14 that faces shorter leg 22 of first wall 14.

Fourth wall, shown generally at 20, comprises a flat planar member positioned between second wall 16 and third wall 18. Fourth wall 20 is perpendicularly situated to second wall 16 and third wall 18 and is parallel to first wall 14. Lip 30 of second wall 16 and lip 36 of third wall 18 serve to hold fourth wall 20 in place therebetween.

Referring back to FIG. 1, side stiffeners, shown generally at 40, are positioned perpendicularly between and fixedly secured to adjacently positioned support members 12 forming the longer side of the box-like structure of frame 10. Side stiffeners 40 are likewise positioned on the opposing longer sides of frame 10. Side stiffeners 40 are substantially L-shaped members having a plurality of openings 42 disposed throughout the surfaces there of in order to facilitate the circulation of air around frame 10 and electronic equipment (not shown) housed within frame 10. Each side stiffener 40 is positioned such that the orientation thereof is varied with respect to adjacent side stiffeners 40. This variation in orientation serves to impart added strength to frame 10 by reinforcing support members 12.

Figure 3:
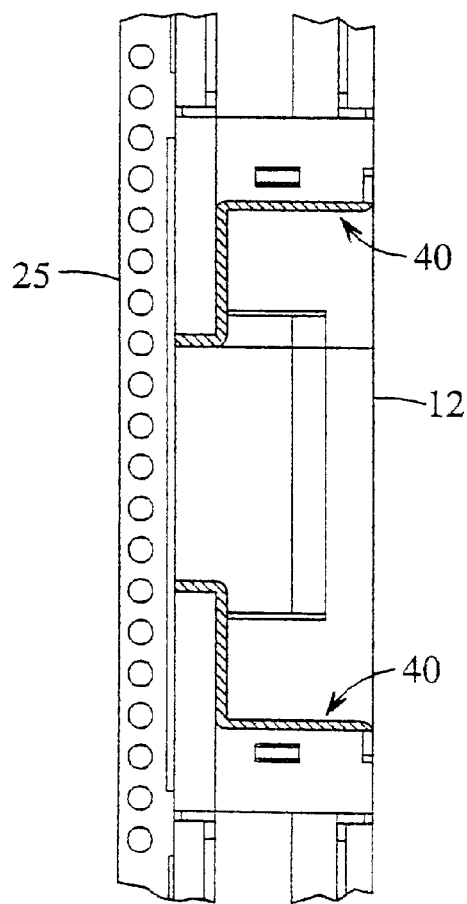
FIG. 3 is a cross sectional view of two side stiffeners of the frame, of the present invention.

Referring to FIG. 3, two side stiffeners 40 are illustrated in cross sectional view, as they would be positioned adjacently between support members 12. The outer edges of L-shaped members are bent at ninety-degree angles. As previously stated, side stiffeners 40 shown are oriented differently between support members 12 to impart added strength to frame 10.

Figure 4:
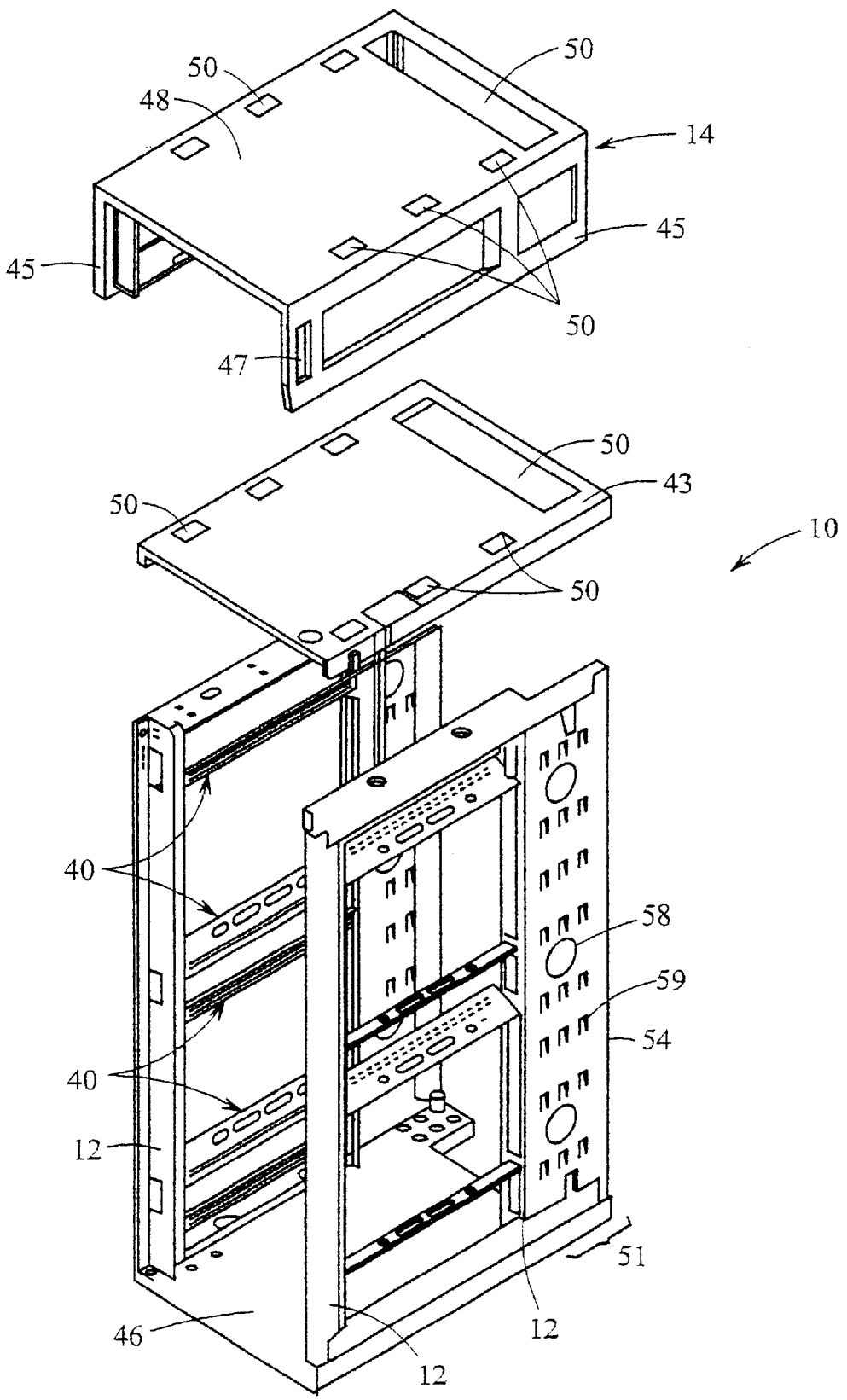
FIG. 4 is an exploded perspective view of the frame, of the present invention, showing the top portion and the extension member, of the present invention.

Referring to FIGS. 1 and 4, a extension member is shown generally at 44. Extension member 44 is movably positioned on the ends of support members 12 over a top portion 43 fixed to frame 10. Extension member 44 comprises a platform section 48, which is a flat planar surface horizontal with the level plane of the flooring surface when frame 10 is oriented in an upright position, and at least two legs 45 depending perpendicularly from the edges of platform section 48 to fit over opposing sides of frame 10. Extension member 44 is slidably positioned over the ends of support members 12 and is secured into place by fasteners such as bolts (not shown) extending through elongated slots 47 or holes (not shown) in legs 45 and tightening the bolts. Loosening the bolts allows the height of frame 10 to be adjusted by sliding extension member 44 vertically so that slots 47 are traversed by the loosened bolts. Retightening the bolts resecures extension member 44 in position. When positioned in a vertical orientation with respect to the flooring surface, the height of frame 10 is variable between 36 units EIA and 42 units EIA or higher. Numerous vent holes 50 perforate top portion and extension member 44 to allow air to circulate thereby causing heat to dissipate from frame 10 when frame 10 is operational with electronic equipment. The securement of height-extending cover 44 to the upper ends of all support members strengthens and improves the structural integrity of frame 10.

Figure 5:
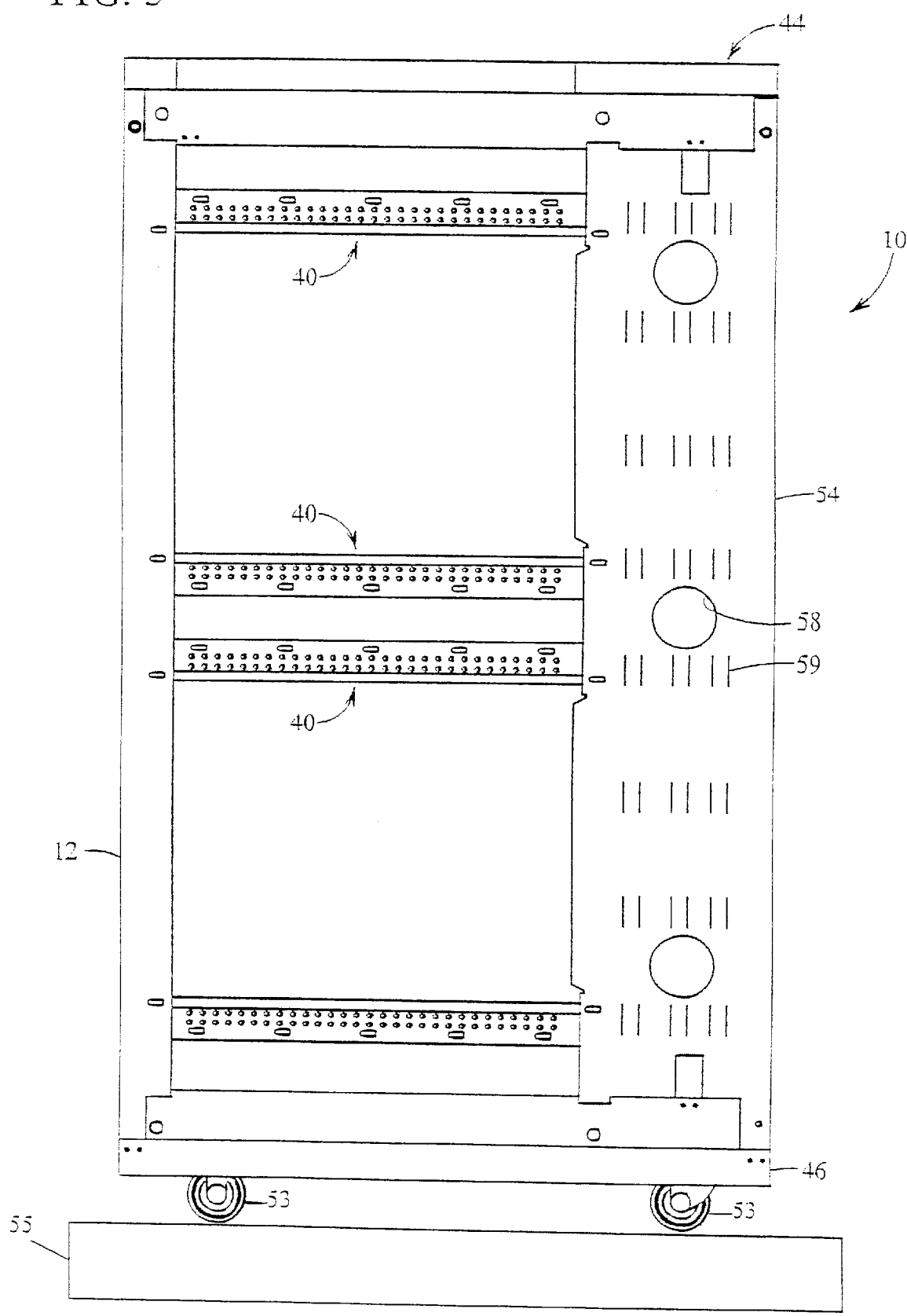
FIG. 5 is a side elevation view of the frame, of the present invention, mounted on rollable casters.

Referring to FIGS. 1 and 4, a base member is shown generally at 46. Base member 46 is a flat planar member adapted to intimately engage the level plane of the flooring surface and provide a surface upon which support members 12 rest. Casters, shown at 53 in FIG. 5, are well known in the art and are securable to the flooring surface side of base member 46 in order to facilitate the rolling of frame 10. Casters installed on the underside of frame 10 allow frame 10 to be fully assembled and populated at one site and shipped on a transport device 55 such as a truck or train, etc. to an installation site without being loaded onto a pallet (not shown). Once the populated frame 10 reaches its destination, frame 10 can be anchored to the flooring surface, as described below, with casters 53 left in place.

Base member 46 also provides a means to which tie down assembly systems (described below with reference to FIG. 9) can be fixed to securely anchor frame 10 to the flooring surface. The securement of base member 46 to the lower ends of support members 12 further strengthens and improves the structural integrity of frame 10 in a manner similar to that accomplished by extension member 44.

Also illustrated in FIGS. 1, 4, and 5 is an extension area, shown generally at 51. When frame 10 is vertically oriented relative to the flooring surface, extension area 51 is disposed on a shorter edge of frame 10. Extension area 51 comprises a first panel 54 and a second panel 56, each extending from two support members 12 that define the shorter edge of frame 10. Panels 54, 56 are secured in a parallel planar relationship with each other and extend between and are attached to extension member 44 and base member 46. Cable holes 58 are formed in panels 54, 56 to enable cables (not shown) to be snaked between pluralities of frames 10 positioned side by side. Belt loop holes 59 are also formed in panels 54, 56, which can be used to secure the cables to panels 54, 56 using a belt (not shown) or a similar means of securement.

Figure 6:
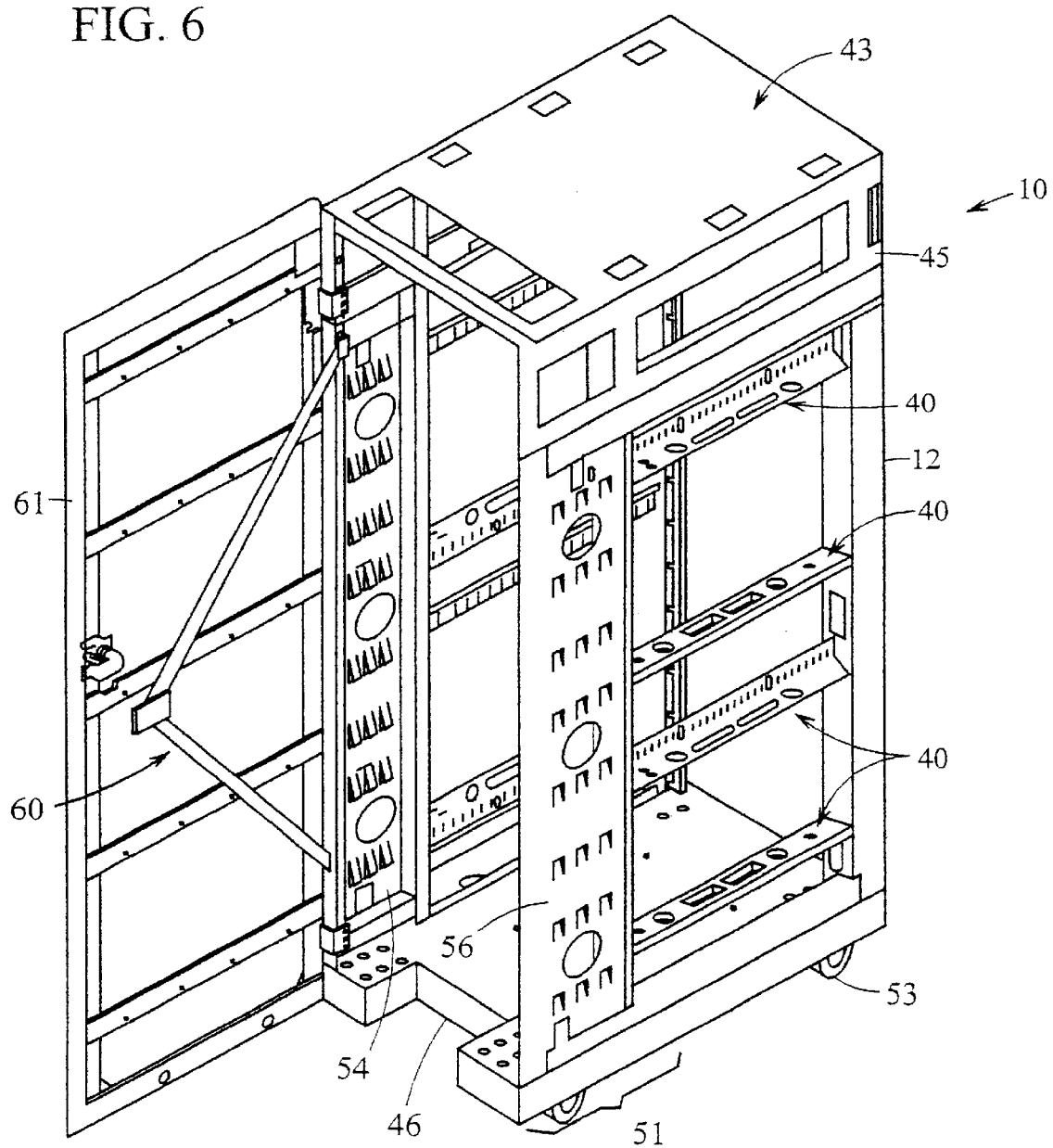
FIG. 6 is a perspective view of the frame, of the present invention, showing a triangular bracket of the frame, of the present invention, in an open position.

FIG. 1 also illustrates a triangular bracket, shown generally at 60. Triangular bracket 60 is hingeably connected to first panel 54 and can swing outward and away from frame 10, as shown in FIG. 6, to allow access to electronic equipment mounted within frame 10. A hinged door 61 may be positioned over triangular bracket 60. The addition of triangular bracket 60 on frame 10 converts frame 10 from a structure able to withstand vibratory forces comparable to those of NEBS GRE-63 Zone 1 and Zone 2 earthquakes to a structure capable of withstanding more severe environments such as those comparable to NEBS GRE-63 Zone 4 earthquakes. Triangular bracket 60 is configured to extend between first panel 54 and second panel 56 and is removably connected to frame 10 in such a manner so as to not inhibit the installation, access to, or removal of the electronic equipment in frame 10. Locking hinge assemblies, shown generally at 62, on first panel 54 and a conventional plate and bolt assembly, shown generally at 64, on second panel 56 allow triangular bracket 60 to be secured in place between first panel 54 and second panel 56.

Figure 7:
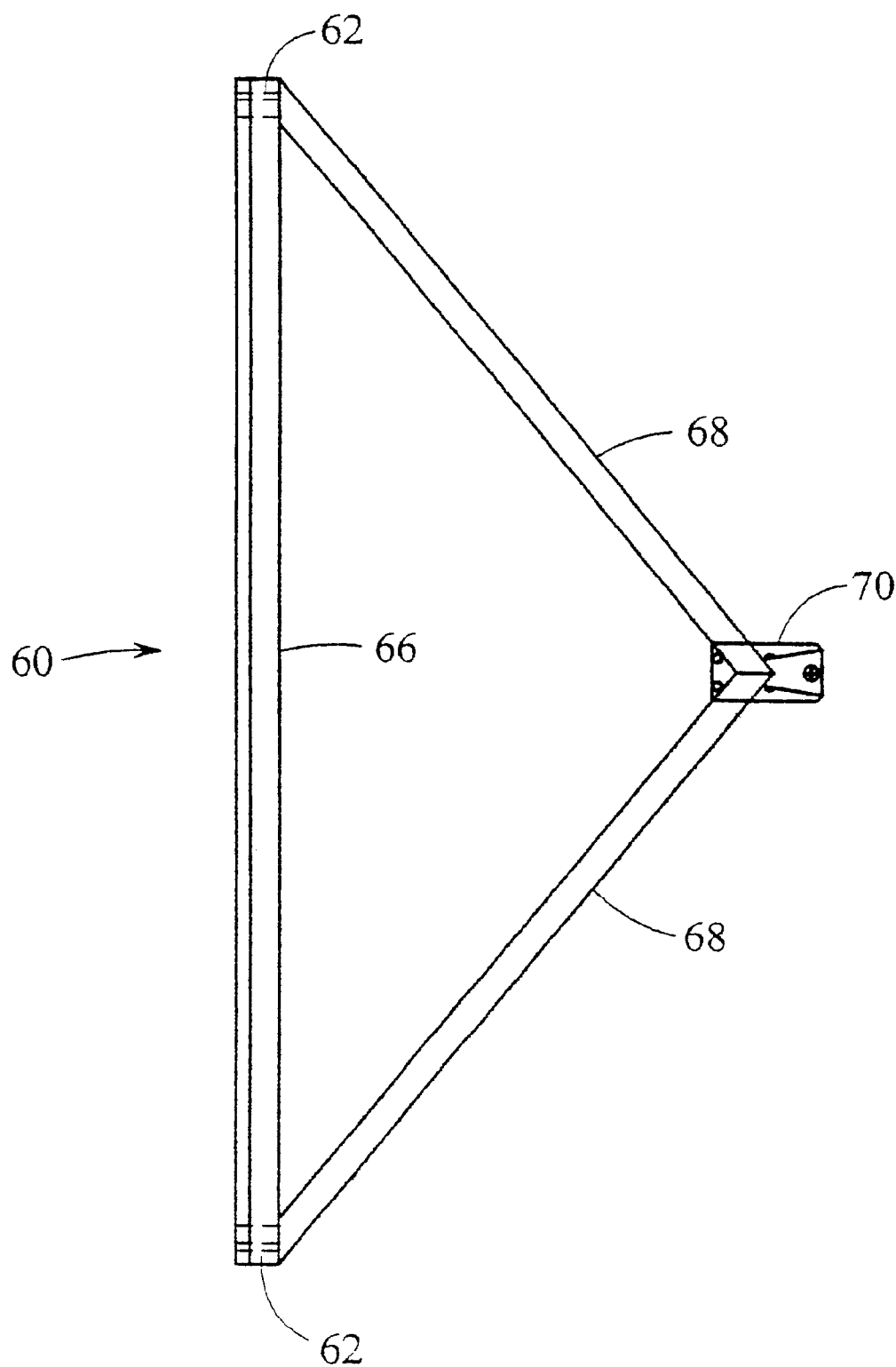
FIG. 7 is a front elevation view of the triangular bracket of the frame, of the present invention.

Referring now to FIG. 7, triangular bracket 60 is shown in greater detail. Triangular bracket 60 comprises a support element 66, which is hingeably attached to an upright surface of first panel 54 and is removably attached thereto using locking hinge assemblies 62 (shown below in greater detail with reference to FIGS. 8A through 8E). Retaining elements 68, of which there are usually two, as shown in the Figures, depend angularly from support element 66 in the same direction and converge on a plate 70 of plate and bolt assembly 64. Support element 66 and retaining elements 68 are dimensioned such that when support element 66 is properly attached to first panel 64, plate 70 of plate and bolt assembly 64 is securable to second panel 56 at a point intermediate the upper and lower ends of second panel 56.

Figure 8A:
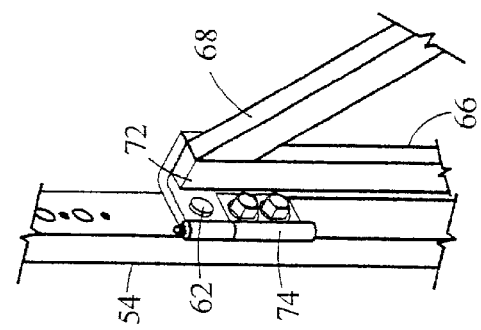
FIGS. 8A through FIGS. 8E are perspective views of various embodiments of a hinge locking system of the triangular bracket of the frame, of the present invention.
Figure 8B:
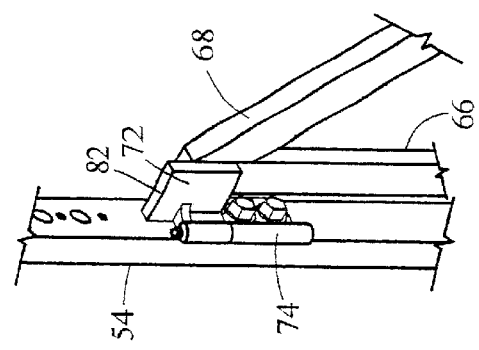
Figure 8C:
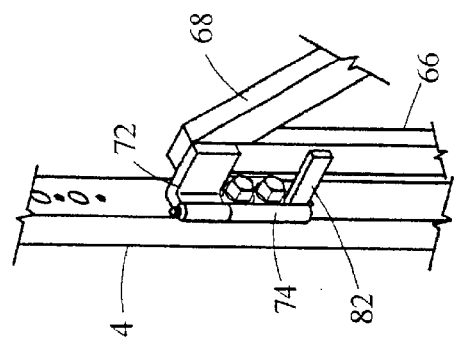
Figure 8D:
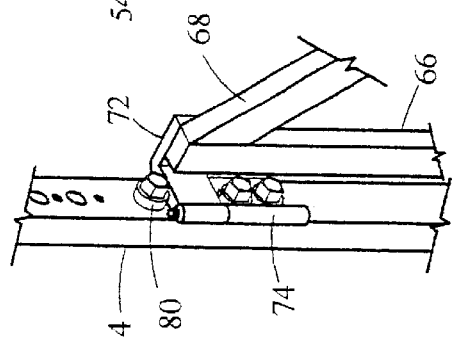
Figure 8E:
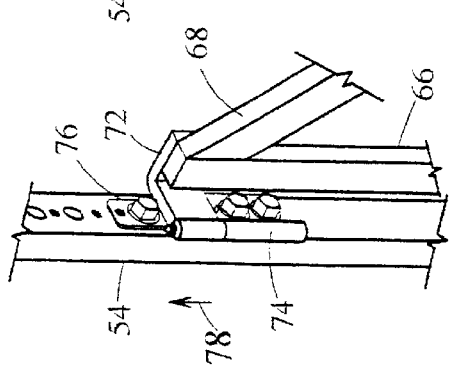

Referring to FIGS. 8A through 8E, various embodiments of locking hinge assemblies 62 may be used to prevent triangular bracket 60 from being removed or from swinging open during a period when increased vibratory forces act on frame 10. In each embodiment, a hinge 72, which is a substantially L-shaped element, is pivotally received on a vertically-projecting rod (not shown) of a mount plate 74 and is securely fixed to support element 66. Mount plate 74 is secured to first panel 54 using conventional methods. In FIG. 8A, hinge 72 is prevented from being lifted off the vertically projecting rod and being removed from mount plate 74 by a locking bracket 76, which, when fixed to first panel 54 as shown and when triangular bracket 60 is in a closed position, prevents the movement of hinge 72 in the direction of an arrow 78. In a similar manner shown in FIG. 8B, hinge 72 is prevented from removal from mount plate 74 by a wide washer 80 secured to first panel 54 using a bolt. In FIG. 8C, after hinge 72 is mounted on the vertically-projecting rod, a pin 82 perpendicularly fixed to support element 66 protrudes laterally into an opening (not shown) on a side of mount plate 74 opposing the side from which the vertically-projecting rod extends. In such a configuration, mount plate 74 is entrapped between hinge 72 and pin 82, and triangular bracket 60 cannot be removed without first being swung open to allow pin 82 to be disengaged from the opening. In FIG. 8D, pin 82 is integrally formed with hinge 72 and functions similar to the embodiment illustrated in FIG. 8C. In FIG. 8E, pin 82 protrudes normally from the flat plane of hinge 72 that engages first panel 54. Pin 82 extends from hinge 72 and into a hole (not shown) in first panel 54 and functions similar to the embodiments of FIGS. 8C and 8D to prevent removal of triangular bracket 60 without first swinging triangular bracket 60 open.

Figure 9:
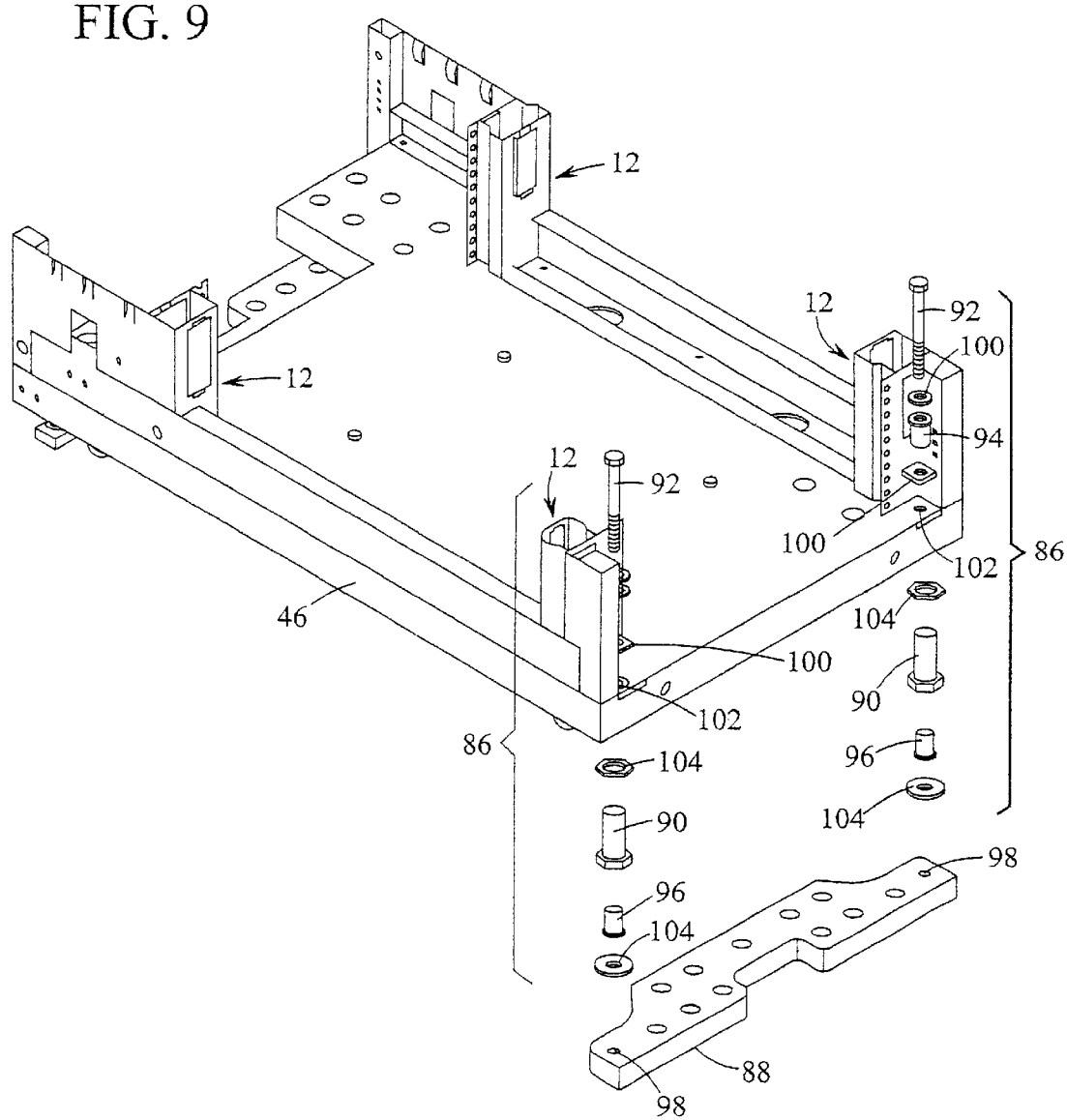
FIG. 9 is an exploded perspective view of a tie down assembly, of the present invention, integrated with a base member of the frame, of the present invention.

Referring now to FIG. 9, tie down assemblies are shown generally at 86 at two adjacent corners of frame 10. Tie down assemblies 86 allow for the secure retention of frame 10 to the flooring surface in both raised and non-raised floor applications. The configuration of tie down assemblies 86 are such that the installation hardware is easily accessible for removal or maintenance. The spacing of frame 10 from the flooring surface using a floor plate (shown below), furthermore, provides electrical and thermal isolation of frame 10 and electronic equipment.

Tie down assemblies 86 are structurally integrated into the lower part of frame 10 to secure frame 10 to the flooring surface and to provide greater strength to frame 10 while maintaining the simplicity of the overall design. Tie down assembly 86 extends between two adjacent corners of base member 46 of frame 10 and comprises a floor plate 88, leveling elements 90, bolts 92, first insulators 94, and second insulators 96. Floor plate 88 has threaded holes 98 drilled therein for threadedly receiving bolts 92 is are preferably fabricated from a material that is electrically non-conductive. Floor plate 88 itself is installed directly on the flooring surface. To secure frame 10 to floor plate 88 using tie down assemblies 86, the shaft portions of bolts 92 are inserted through a plurality of washers 100 and first insulators 94 and through holes 102 inbase member 46 from the frame side of base member 46. First insulators 94 are retained on the shaft portions of bolts 92 against the head portions of bolts 92. Second insulators 96 are inserted into leveling elements 90, which are then received on the shaft portions of bolts 92, that protrude through the floor plate side of base member 46. Leveling elements 90, when properly received on the shaft portions of bolts 92 extend through holes 102 inbase member 96 to receive first insulators 94 therein. When first insulators 94 and second insulators 96 are properly received within leveling elements 90, bolts 92 protrude from leveling elements 90 and are threadedly received in threaded holes 98 drilled in floor plate 88. Washers 104 may be utilized in the assembly process to properly space bolts 92 from base member 46 and floor plate 88. A second tie down assembly 86 with a second floor plate 88 and hardware identical to the above tie down assembly 86 extends between other adjacent corners of base member 46 of frame 10 to further secure frame 10 to the flooring surface.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the appended claims.

We claim:

1. A method for transporting equipment comprising:
    populating a frame with said equipment;
    loading said populated frame on a separate transport device;
    unloading said populated frame from said separate transport device;
    depositing said populated frame at a delivery location, wherein said depositing includes leveling said populated frame with a leveling element disposed at said populated frame;
    installing an extension member over a top portion of said frame, wherein said extension member has surfaces configured to provide a space; and
    adjusting a position of said extension member by slidably moving said extension member in a longitudinal direction of said frame to provide a varied space.

2. The method for transporting of claim 1 wherein said frame includes casters for facilitating rolling of said populated frame during loading, unloading and depositing said populated frame.

3. The method for transporting of claim 1 wherein said depositing said populated frame at the delivery location further includes anchoring said populated frame to a flooring surface.

4. The method for transporting of claim 3 wherein said anchoring step includes assembling a floor plate at the bottom of said populated frame, said floor plate being in a position to contact with said flooring surface.

5. The method for transporting of claim 4 wherein said leveling element is disposed between the bottom of said populated frame and said floor plate.

6. The method for transporting of claim 1, wherein said adjusting step includes:
    loosening a fastener securing said extension member onto a selected place of said frame through an elongated slot formed on one of said surfaces of said extension member; and
    retightening said fastener when said extension member is repositioned to provide a selected space.

7. The method for transporting of claim 6, further including adding an extension area at a side of said frame, said extension area having panels to provide another space extended from said side of said frame in a widthwise direction of said frame.

8. The method for transporting of claim 7, further including:
    opening a panel of said extension area to load or unload said equipment into or from said frame; and
    closing said panel when said equipment is stored in said frame, wherein said panel is hingeably connected to another panel of said extension area using a triangular bracket.

* * * * *